United States Patent [19]
Huang

[11] Patent Number: 6,147,873
[45] Date of Patent: Nov. 14, 2000

[54] CPU MODULE MOUNTING RACK

[76] Inventor: Chin-Chung Huang, 5F-23, 70, Fu-Shing Road, Taoyuan, Taiwan

[21] Appl. No.: 09/010,447

[22] Filed: Jan. 22, 1998

[51] Int. Cl.[7] ............................. H05K 7/12; H01R 13/629
[52] U.S. Cl. .......................... 361/759; 361/756; 361/741; 361/728; 361/752; 361/825
[58] Field of Search ..................................... 361/756, 728, 361/736, 741, 752, 753, 759, 801, 802, 825

[56] References Cited

U.S. PATENT DOCUMENTS

| | | | |
|---|---|---|---|
| 5,470,242 | 11/1995 | Cheng et al. | 439/157 |
| 5,730,611 | 3/1998 | Cheng et al. | 439/160 |
| 5,889,656 | 3/1999 | Yin | 361/759 |

*Primary Examiner*—Leo P. Picard
*Assistant Examiner*—Hung Van Duong

[57] ABSTRACT

A CPU module mounting rack includes bottom rail mounted on a mother board at the top to hold a CPU connector on the mother board, two holder frames mounted on the mother board at the top and holding the bottom rail therebetween, two upright rails respectively pivoted to the holder frames and adapted to hold a CPU module in a vertical position in connection with the CPU connector, two locating frames respectively mounted on the mother board at the bottom, each locating frame having two upright locating bolts respectively inserted through respective through holes on the mother board and respective through holes on the holder frames, and two pairs of locking plates respectively inserted into respective sliding tracks on the holder frames and moved between the locking position where the locating bolts of the locating frames are secured to the respective through holes on the holder frames, and the unlocking position where the locating bolts of the locating frames are unlocked and can be removed from the vertical through holes on the holder frames.

2 Claims, 8 Drawing Sheets

CPU MODULE MOUNTING RACK

BACKGROUND OF THE INVENTION

The present invention relates to a CPU module mounting rack adapted for mounting on a mother board for holding a CPU module in connection with a CPU connector on the mother board, and more particularly to such a CPU module mounting rack which is collapsible and detachable.

Figure 1:
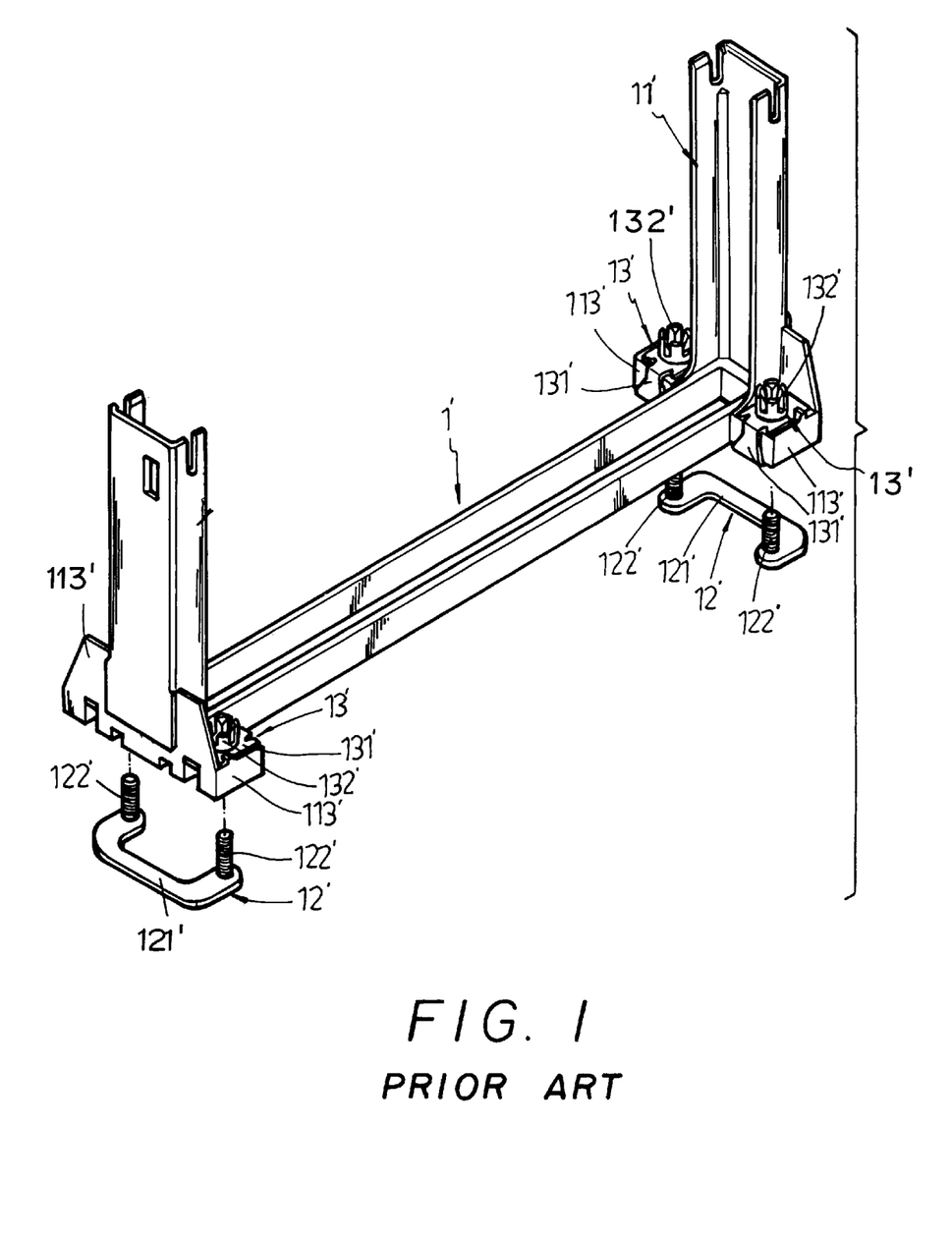
FIG. 1A is an exploded view of a CPU module mounting rack according to the prior art.
Figure 2:
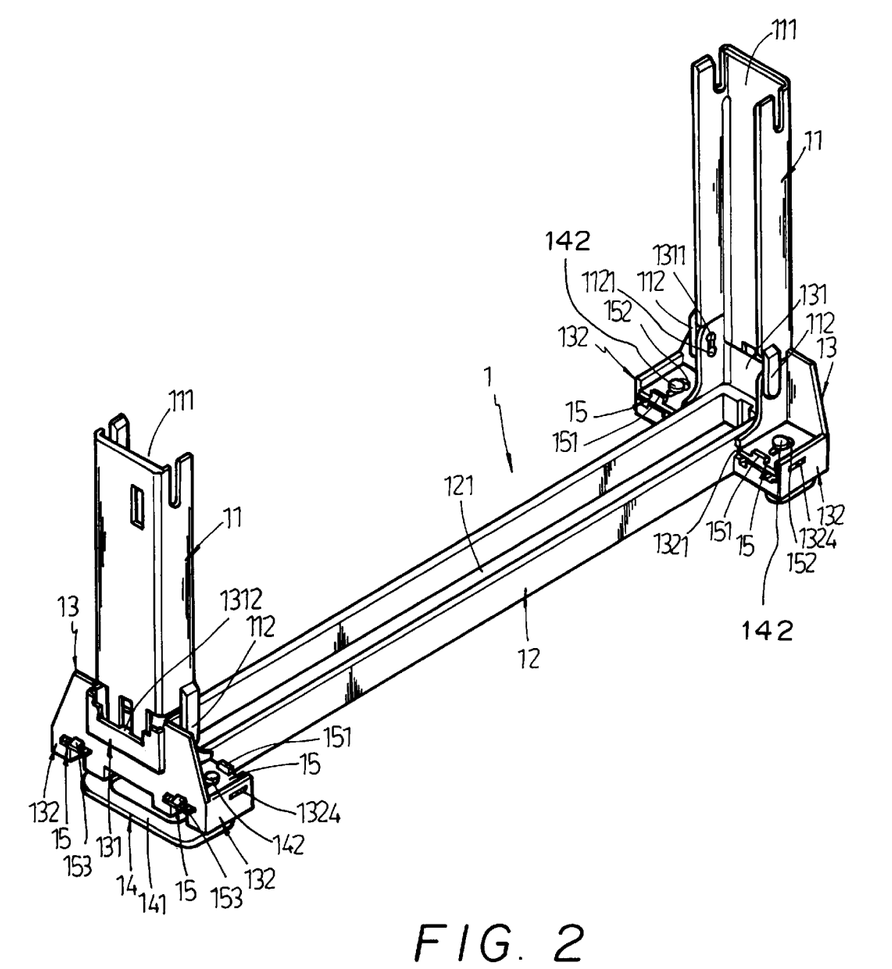
FIG. 2 is a perspective view of a CPU module mounting rack according to the present invention.

FIG. 1 shows a CPU module mounting rack 1' according to the prior art. This structure of CPU module mounting rack 1' comprises a substantially U-shaped base frame 11' two pairs of hollow mounting blocks 113' bilaterally connected to the U-shaped base frame 11' at two opposite ends at the bottom, two locating frames 12' adapted to secure the mounting blocks 113' to a mother board, a plurality of lock nut holders 13' respectively mounted on the mounting blocks 113' by a respective frame 131' and holding a respective nut 132' in the mounting blocks 113'. Each locating frame 12' comprises a substantially U-shaped base plate 121' and two screw rods 122' respectively raised from the base plate 121'. When the screw rods 122' of the locating frames 12' are respectively inserted into a respective through hole on each mounting block 113'the nuts 132' on the lock nut holders 13' are respectively screwed up with the screw rods 122'. This structure of CPU module mounting rack is complicated, therefore its manufacturing cost is high. Another drawback of this structure of CPU module mounting rack is that a special tool must be used when threading the nuts 132' onto the screw rods 122'. Furthermore, because the screw rods 122' do not tightly fit the respective through holes on the mounting blocks 113' the U-shaped base frame 11' tends to be vibrated on the screw rods 122' of the locating frames 12'.

SUMMARY OF THE INVENTION

The present invention has been accomplished to provide a CPU module mounting rack which eliminates the aforesaid drawbacks. It is one object of the present invention to provide a CPU module mounting rack which is collapsible. It is another object of the present invention to provide a CPU module mounting rack which is detachable. It is still another object of the present invention to provide a CPU module mounting rack which is inexpensive to manufacture. It is still another object of the present invention to provide a CPU module mounting rack which is firmly retained in position when installed. According to one aspect of the present invention, the CPU module mounting rack comprises bottom rail mounted on a mother board at the top to hold a CPU connector on the mother board, two holder frames mounted on the mother board at the top and holding the bottom rail therebetween, two upright rails respectively pivoted to the holder frames and adapted to hold a CPU module in a vertical position in connection with the CPU connector, two locating frames respectively mounted on the mother board at the bottom, each locating frame having two upright locating bolts respectively inserted through respective through holes on the mother board and respective through holes on the holder frames, and two pairs of locking plates respectively inserted into respective sliding tracks on the holder frames and moved between the locking position where the locating bolts of the locating frames are secured to the respective through holes on the holder frames, and the unlocking position where the locating bolts of the locating frames are unlocked and can be removed from the vertical through holes on the holder frames. According to another aspect of the present invention, each upright rail comprises two coupling blocks bilaterally raised from the bottom end, two pivot pins respectively raised from the coupling blocks at an inner side and coupled to respective coupling holes on the corresponding holder frame for permitting the respective upright rail to be turned between a horizontal position and a vertical position, and two downwardly extended hooked springy strips which are forced into engagement with a hooked portion on the corresponding holder frame for permitting the respective upright rail to be firmly retained in the vertical position. According to still another aspect of the present invention, the locating bolts of locating frames comprise each a plurality of longitudinal ribs spaced around the periphery and respectively stopped against peripheral walls of the respective through holes on the holder frames.

DETAILED DESCRIPTION OF THE PREFERRED EMBODIMENT

Referring to FIGS. from 2, 3, 4, 8 and 9, a CPU module mounting rack in accordance with the present invention is generally comprised of a bottom rail 12 mounted on a mother board 4 at the top to hold a CPU connector 3 on the mother board 4, two holder frames 13 mounted on the mother board 4 at the top and holding the bottom rail 12 therebetween, two upright rails 11 respectively connected to the holder frames 13 and adapted to hold a CPU module 2 in a vertical position in connection with the CPU connector 3, two locating frames 14 respectively mounted on the mother board 4 at the bottom, and two pairs of locking plates 15 respectively mounted on the holder frames 13 and fastened to the locating frames 14 to secure the holder frames 13, the mother board 4 and the locating frames 14 together.

Figure 8:
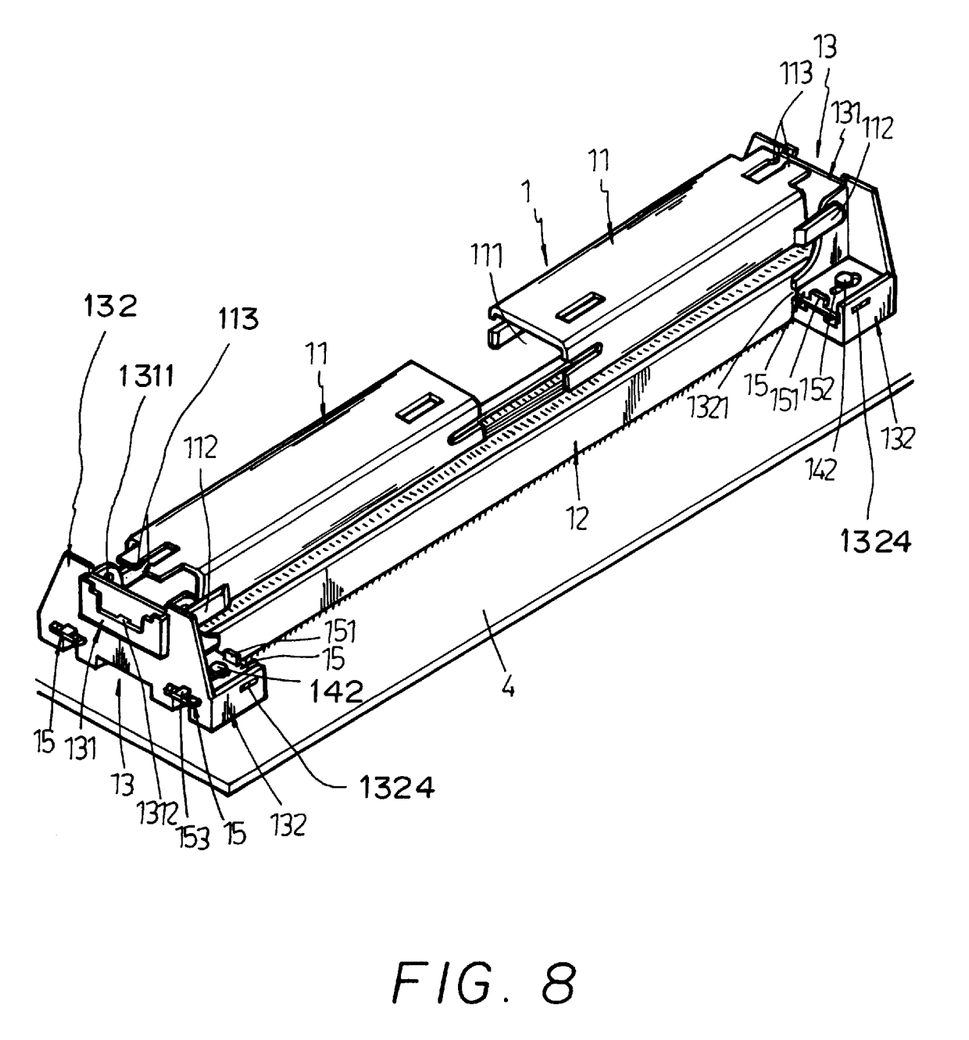
FIG. 8 is a perspective view of the present invention, showing the CPU module mounting rack installed in the mother board, the upright rails collapsed.
Figure 9:
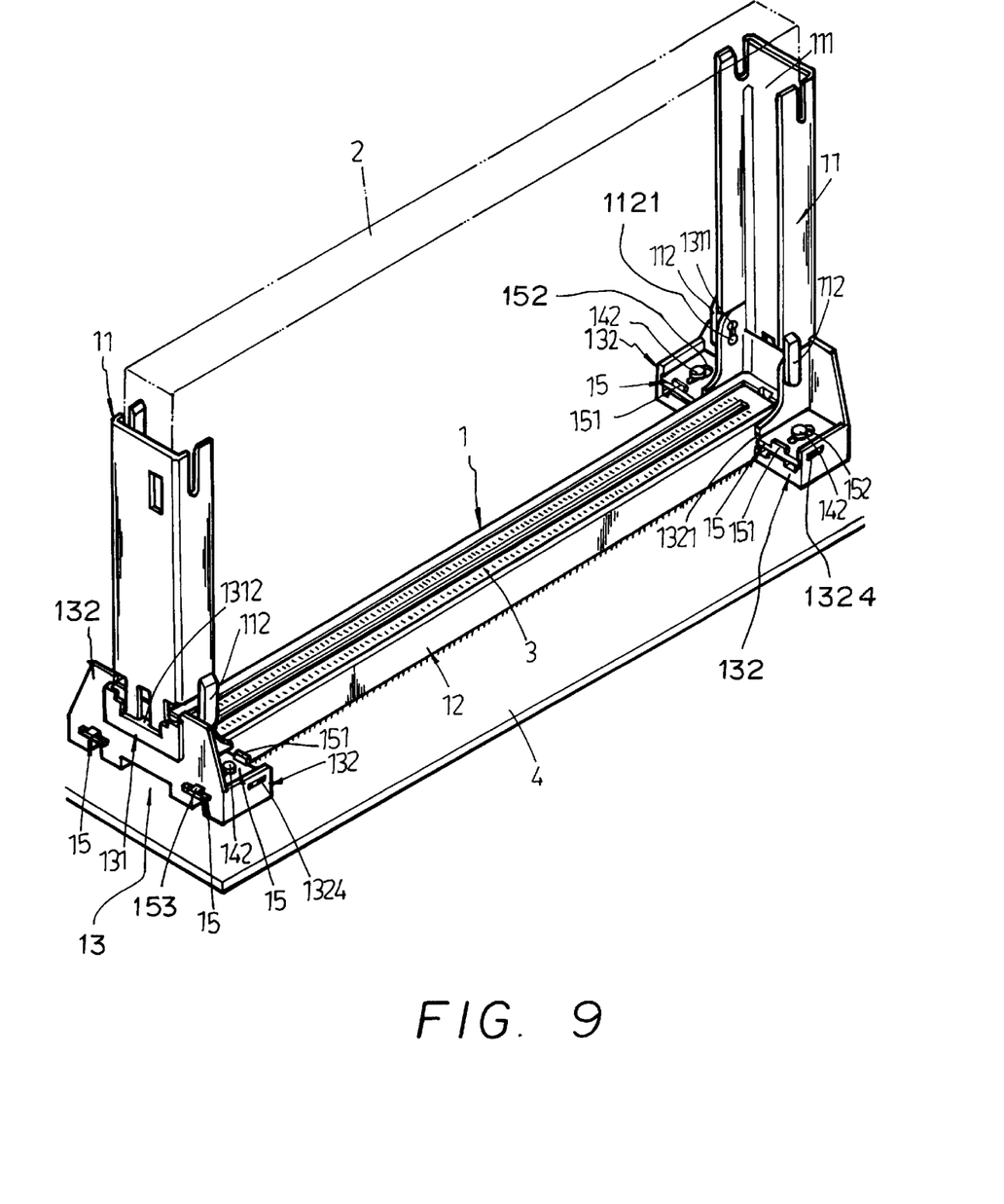
FIG. 9 is a perspective view of the present invention, showing the upright rails set in the vertical position, the CPU module inserted into the longitudinal sliding grooves on the upright rails and connected to the CPU connector.

Referring to FIGS. from 2 to 4 again, the bottom rail 12 is connected between the two holder frames 13, comprising a longitudinal slot 121, which receives the CPU connector 3 (see also FIGS. 8 and 9). Each holder frame 13 comprises a substantially U-shaped middle block 131 which holds one upright rail 11, and two mounting blocks 132 integral with the U-shaped middle block 131 at two opposite sides. The U-shaped middle block 131 comprises two coupling holes 1311 respectively disposed at two opposite upright side walls thereof, and a hooked portion 1312 raised from a back side thereof. Each coupling hole 1311 is formed of two vertically spaced circular holes and a narrow opening connected between the circular holes. Each mounting block 132 comprises a horizontal sliding track 1321, a vertical through hole 1322 at the center, a longitudinal slot 1324 horizontally disposed at an outer side in communication with the horizontal sliding track 1321, and a notch 1323 at a back side thereof. Each locating frame 14 comprises a substantially U-shaped base plate 141, two circular blocks 1421 raised from the U-shaped base plate 141 at one side near its two opposite ends, and two locating bolts 142 respectively raised from the circular blocks 1421. Each locating bolt 142 comprises a plurality of longitudinal ribs 1422 equiangularly spaced around the periphery, and a neck 1423 near the top. Each locking plate 15 comprises a key hole 152 at the center (the key hole 152 is formed of a circular hole and an oblong hole extended from the circular hole, wherein the width of the oblong hole is smaller than the diameter of the circular hole), a finger strip 151 raised from one end, a raised bevel block 153 raised from an opposite end, and a plurality of beveled projecting portions 154 at one lateral side. Each upright rail 11 comprises a longitudinal sliding groove 111 adapted to guide the inserted CPU module 2 into connection with the CPU connector 3 (see also FIG. 9), two coupling blocks 12 bilaterally raised from the bottom end thereof, two pivot pins 1121 respectively raised from the coupling blocks 12 at an inner side and adapted for coupling to the coupling holes 1311 on the middle block 131 of one holder frame 13, and a pair of hooked springy strips 113 integral with its bottom end.

Figure 5:
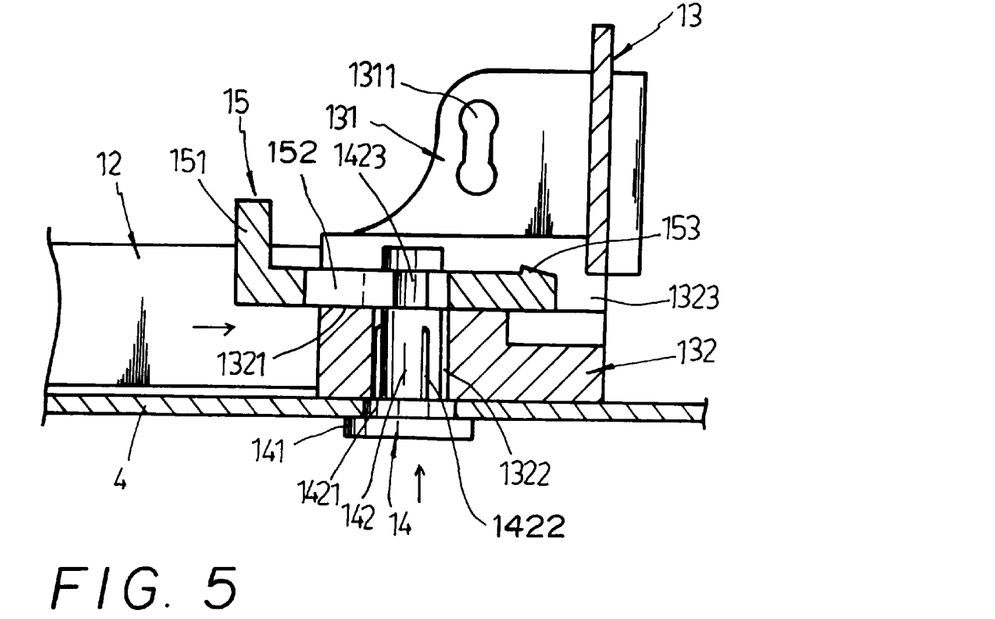
FIG. 5 a sectional assembly view of a part of the present invention, showing the locking plate moved to the unlocking position.

The installation process of the present invention is outlined hereinafter with reference to FIGS. 5 and 6. The locking plates 15 are respectively inserted into the sliding tracks 1321 on the mounting blocks 132 of the holder frames 132, permitting the circular holes of the key holes 152 on the locking plates 15 to be respectively aligned with the vertical through holes 1322 on the mounting blocks 132 of the holder frames 132. Then the locating bolts 142 of the locating frames 14 are respectively inserted through respective through holes on the mother board 4 into the vertical through holes 1322 on the mounting blocks 132 of the holder frames 13 and the key holes 152 on the locking plates 15, permitting the circular blocks 1421 of the locating frames 14 to be respectively fitted into the respective through holes on the mother board 4, and the mother board 4 to be retained between the base plates 141 of the locating frames 14 and the holder frames 13. After the locating bolts 142 have been respectively inserted into the vertical through holes 1322 on the mounting blocks 132 of the holder frames 13, the longitudinal ribs 1422 of the locating bolts 142 are peripherally stopped against the respective peripheral walls of the vertical through holes 1322. Then, the locking plates 15 are respectively pushed to the end in the sliding tracks 1321 on the mounting blocks 132 of the holder frames 13, to force the oblong holes of the respective key holes 152 into engagement with the necks 1423 of the locating bolts 142, the respective beveled projecting portions 154 into engagement with the longitudinal slots 1324 on the mounting blocks 132, and the respective raised bevel blocks 153 into engagement with the notches on the mounting blocks 132. When disconnecting the locking plates 15 from the holder frames 13, the raised blocks 153 are pressed down and disconnected from the respective notches 1323, and then the locking plates 15 are pulled backwards at a distance, for permitting the locating bolts 142 to be moved with the respective locating frames 14 away from the mother board 4 and the holder frames 13.

Figure 3:
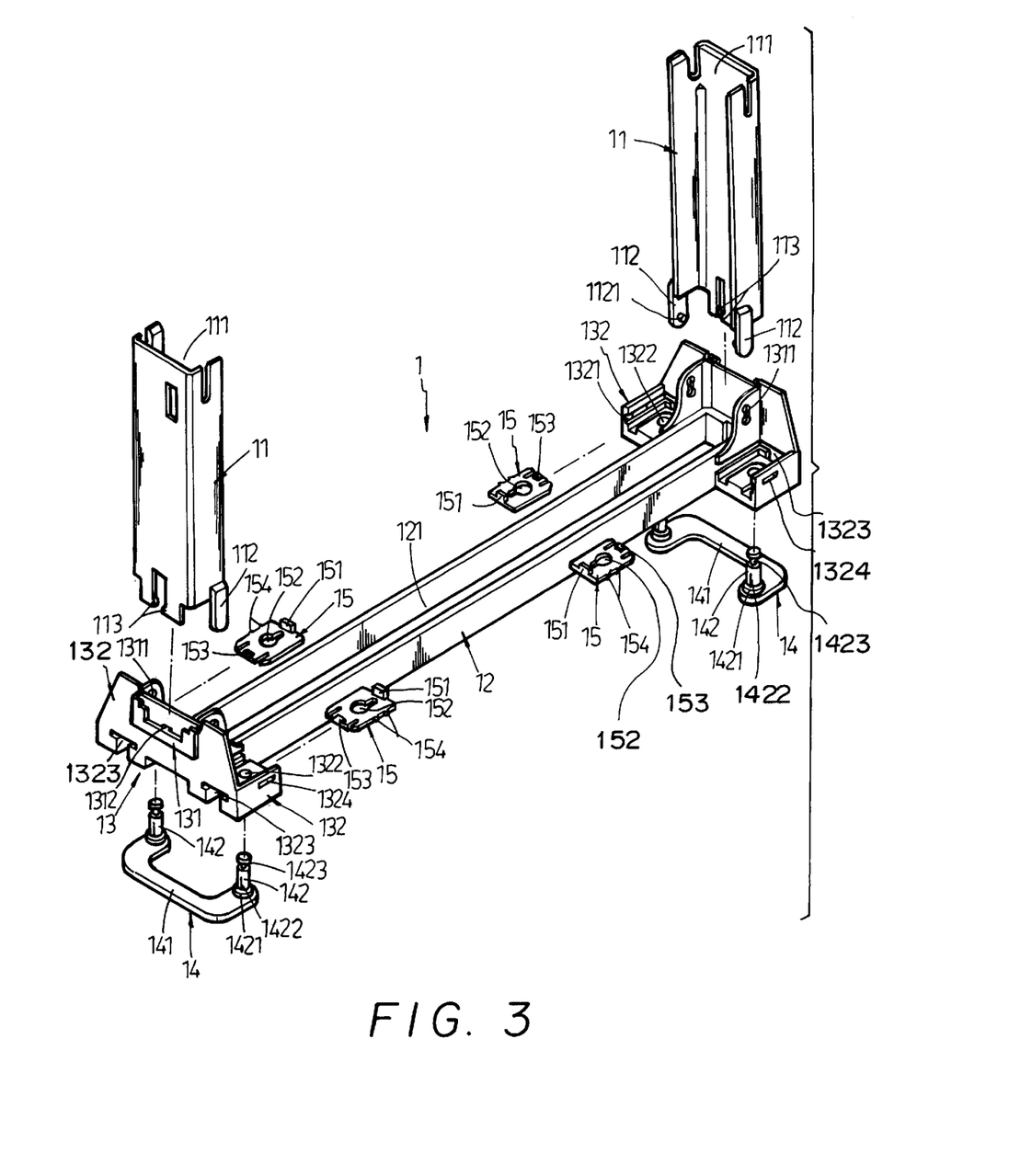
FIG. 3 an exploded view of the CPU module mounting rack shown in FIG. 2.
Figure 4:
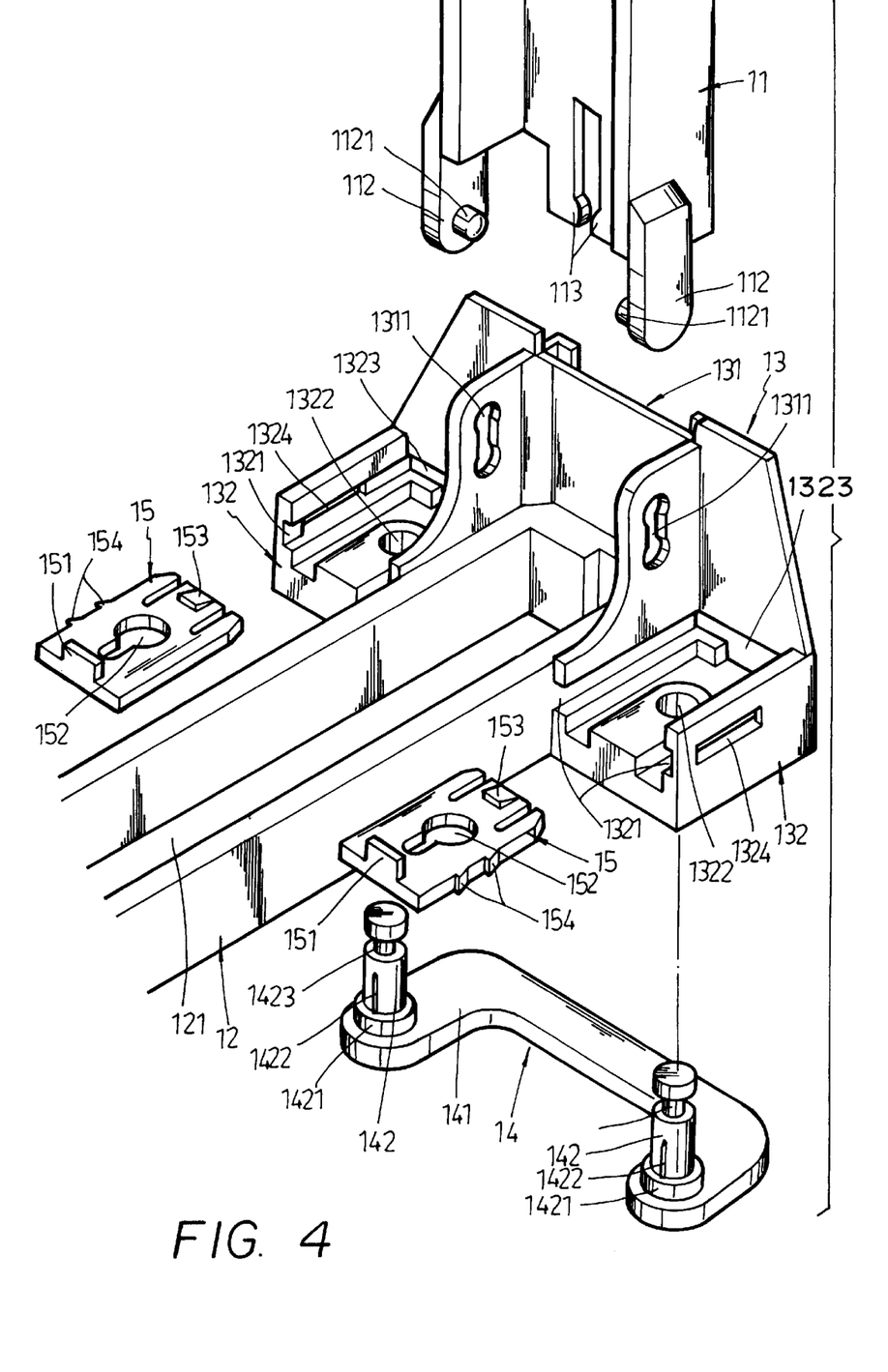
FIG. 4 is an exploded view in an enlarged scale of a part of the present invention.
Figure 7:
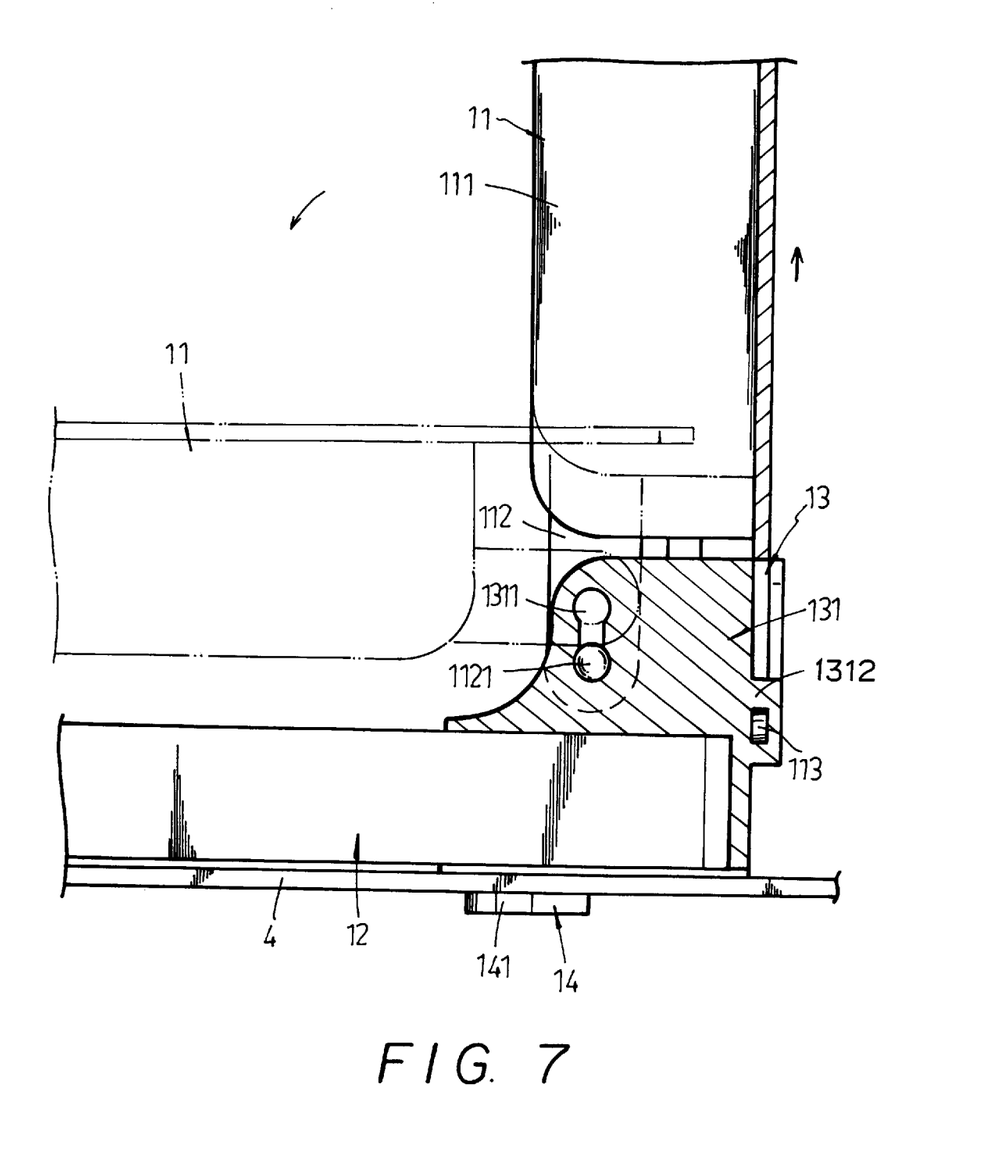
FIG. 7 is a plain view of a part of the present invention, showing the upright rail turned between the horizontal position and the vertical position.

Referring to FIGS. 3, 4 and 7, the upright rails 11 are respectively coupled to the holder frames 13 by inserting the pivot pins 1121 on the coupling blocks 112 of the upright rails 11 into the coupling holes 1311 on the middle blocks 131 of the holder frames 13. When the upright rails 11 are pulled upwards to move the pivot pins 1121 from the bottom ends of the coupling holes 1311 to the top ends thereof, the upright rails 11 can then be turned between a vertical position, namely, the operative position where the upright rails 11 are maintained in parallel (see also FIG. 9), and a horizontal position, namely, the collapsed position where the upright rails 11 are closely attached to the bottom rail 12 (see also FIG. 8).

Figure 6:
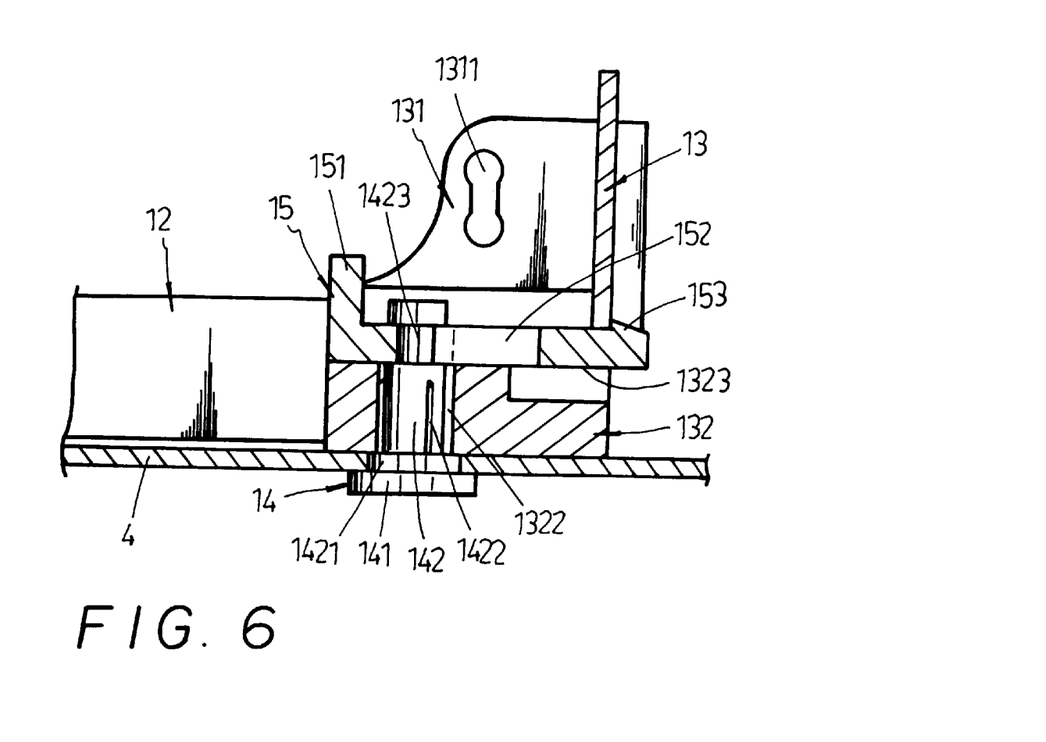
FIG. 6 is similar to FIG. 5, but showing the locking plate moved to the locking position.

Referring to FIGS. 6 and 9, when the upright rails 11 are turned to the vertical position (the operative position), the upright rails 11 are vertically pressed down to force the respective hooked springy strips 113 into engagement with the hooked portions 1312 on the middle blocks 131 of the holder frames 13, and therefore the upright rails 11 are retained in the operative position, for permitting the CPU module 2 to be inserted into the longitudinal sliding grooves 111 on the upright rails 11 and connected to the CPU connector 3 in the longitudinal slot 121 on the bottom rail 12.

While only one embodiment of the present invention has been shown and described, it will be understood that various modifications and changes could be made thereunto without departing from the spirit and scope of the invention disclosed.

What the invention claimed is:

1. A CPU module mounting rack comprising a bottom rail mounted on a mother board at the top to hold a CPU connector on said mother board, two holder frames mounted on said mother board at the top and holding said bottom rail therebetween, two upright rails respectively connected to said holder frames and adapted to hold a CPU module in a vertical position in connection with said CPU connector, two locating frames respectively mounted on said mother board at the bottom, and two pairs of locking plates respectively mounted on said holder frames and fastened to said locating frames to secure said holder frames, said mother board and said locating frames together, wherein:

said holder frames comprise each a substantially U-shaped middle block, and two mounting blocks integral with said U-shaped middle block at two opposite sides, said U-shaped middle block comprising two coupling holes respectively disposed at two opposite upright side walls thereof, and a hooked portion raised from a back side thereof, said coupling holes being respectively formed of two vertically spaced circular holes and a narrow opening connected between said circular holes, said mounting blocks comprising each a horizontal sliding track which receives said locking plates respectively, a vertical through hole at the center, a longitudinal slot horizontally disposed at an outer side in communication with said horizontal sliding track, and a notch at a back side thereof;

said locating frames comprise each a substantially U-shaped base plate, two circular blocks raised from said U-shaped base plate at one side near two opposite ends thereof and fitted into respective through holes on said mother board, and two locating bolts respectively raised from said circular blocks and inserted into the vertical through holes on the mounting blocks of said holder frames, said locating bolts comprising each a neck;

said locking plates are respectively inserted into the sliding tracks on the mounting blocks of said holder frames and moved between a locking position and an unlocking position, said locking plates comprising each a key hole at the center which receives the locating bolts of said locating frames respectively, said key hole comprised of a circular hole and an oblong hole extended from the circular hole, the circular hole of said key hole being aligned with vertical through hole on one mounting block when the respective locking plate is moved to the unlocking position, the oblong hole of said key hole being forced into engagement with the neck of the corresponding locating bolt on one locating frame when the respective locking plate is moved to the locking position, a finger strip raised from one end thereof for the holding of the fingers, a raised bevel block raised from an opposite end thereof which is forced into engagement with the notch on the corresponding mounting block when the respective locking plate is moved to the locking position, and a plurality of beveled projecting portions at one lateral side forced into engagement with the longitudinal slot on the corresponding mounting block;

said upright rails comprise each two coupling blocks bilaterally disposed at one end, two pivot pins respectively raised from said coupling blocks at an inner side and respectively coupled to the coupling holes on the middle blocks of said holder frames, and a pair of downwardly extended, hooked springy strips respectively forced into engagement with the hooked portions on the middle blocks of said holder frames.

2. The CPU module mounting rack of claim 1, wherein said locating bolts of said locating frames comprise each a plurality of longitudinal ribs spaced around the periphery and respectively stopped against peripheral walls of the vertical through holes on said mounting blocks of said holder frames.

* * * * *